United States Patent [19]

Gwozdz

[11] 4,451,326

[45] May 29, 1984

[54] METHOD FOR INTERCONNECTING METALLIC LAYERS

[75] Inventor: Peter S. Gwozdz, Cupertino, Calif.

[73] Assignee: Advanced Micro Devices, Inc., Sunnyvale, Calif.

[21] Appl. No.: 529,920

[22] Filed: Sep. 7, 1983

[51] Int. Cl.³ .......................... C23F 1/03; B44C 1/22; C03C 15/00; C03C 25/06
[52] U.S. Cl. ...................................... 156/643; 29/591; 156/644; 156/646; 156/653; 156/656; 156/657; 156/659.1; 204/192 E; 357/71; 427/90; 430/317; 430/318
[58] Field of Search ................ 427/38, 39, 88, 89, 427/90, 91; 357/71; 29/590, 591; 204/192 EC, 192 E; 430/313, 317, 318; 156/643, 644, 646, 650–653, 656, 657, 659.1, 661.1; 252/79.1

[56] References Cited

U.S. PATENT DOCUMENTS 4,076,575  2/1978  Chang .................................. 156/656
4,164,461  8/1979  Schilling ....................... 204/192 EC
4,172,004 10/1979  Alcorn et al. ........................ 156/643
4,184,909  1/1980  Chang et al. ........................ 156/643
4,415,606 11/1983  Cynkar .................................. 427/90

*Primary Examiner*—William A. Powell
*Attorney, Agent, or Firm*—Patrick T. King; James M. Heslin

[57] ABSTRACT

A method for forming multiple conductive interconnect layers on a semiconductor device comprises defining a first conductive metal layer, applying a first insulating layer thereon, planarizing the first insulating layer by etching a sacrificial planarization layer, applying a second insulating layer, forming vias through first and second insulating layers and applying a second conductive layer thereon. Optionally, a third insulating layer can be applied over the first two and stepped vias formed to improve the interconnection of the first and second layers. The method reduces metallization failure associated with irregularities in the intermediate insulating layers.

28 Claims, 15 Drawing Figures

METHOD FOR INTERCONNECTING METALLIC LAYERS

BACKGROUND OF THE INVENTION

1. Field of the Invention

The present invention relates generally to the manufacture of semiconductor devices, and more particularly to a method for forming interconnects between conductive metal layers which are vertically spaced apart by insulating layers.

2. Description of the Prior Art

Conventional semiconductor processing requires the formation and patterning of metal conductive layers, typically aluminum or aluminum silicon, to define interconnections between various locations on the device. Often, it is necessary to form two or more such conductive layers which are vertically spaced apart and separated by intermediate insulating layers, typically formed from silicon dioxide. This is particularly true with high-density devices where the necessary interconnections cannot be provided by a single aluminum layer.

The formation of multiple conductive layers presents a number of difficulties. First, when an insulating layer is applied over the first conductive layer, the surface of the insulating layer will often display irregularities, including crevices, outcroppings, cusps, and the like, which result from the uneven profile of the underlying interconnect pattern. Such irregularities have been found to cause breaks or openings in the overlying conductive layer. The resulting incomplete metal coverage has been found to be a primary cause of metallization failure in the manufacture of semiconductor devices.

A second problem arises from holes or other anomalies in the insulating layer which are a result of defects in the glass insulating material, improper application of such insulating material, defects in the masks used to form vertical interconnect holes (vias) in the insulating layer, and the like. Such anomalies can cause short circuiting between the conductive layers or lead to other malfunctioning in the device.

A final problem arises in the formation of vias which are the holes in the intermediate insulating layer which allow electrical connection of the layers. It is often desirable to provide vias having very small cross-sectional areas when connecting to very narrow interconnects. Conventional photo-lithographic techniques are limited in their ability to provide such small vias.

It would thus be desirable to provide a method for forming multiple conductive layers which are free from defects caused by irregularities in the intermediate insulating layer from holes or other anomalies in the insulating layer which result from irregularities in the mask or improper application of the insulating layer. It would be particularly desirable to provide such a method which also allows the formation of narrow vias for interconnecting the different conductive layers.

Addams and Capio (1981) J. Electrochem. Soc. 128:423-429 describe a method for planarizing a phosphorous-doped silicon dioxide insulating layer by applying a layer of photoresist over the silicon dioxide to define a smooth surface and then sputter etching the combined layers under conductions which etch the photoresist and the silicon dioxide at the same rate. In this way, the silicon dioxide layer attains a profile which generally matches the smooth profile of the sacrificial photoresist layer. The method of Addams and Capio is applied to a silicon dioxide layer which overlies a polycrystalline silicon substrate. Addams and Capio do not consider the problems associated with forming multiple conductive interconnect layers.

SUMMARY OF THE INVENTION

The present invention provides a method for forming multiple conductive metal layers on a semiconductor device and for interconnecting those layers through intermediate insulating layers. The method of the present invention minimizes the occurrence of defects associated with metallization failure and allows the formation of multiple layers in a single reactor to reduce the manufacturing time required and lessen the potential for damage associated with transfer between reactors.

The method comprises defining a first metal conductive layer having a preselected interconnect pattern on the semiconductor device. A first insulating layer is applied over the first metal layer in a conventional manner. The first insulating layer, however, will have an irregular profile corresponding to the topography of the first metal layer. In order to smooth the surface of the insulating layer, a planarization layer is next applied. The planarization layer will have a low viscosity and will flow at relatively low temperatures to form a smooth profile. By then etching both the planarization layer and the insulating layer, the smoothed profile of the planarization layer can be imparted to the insulating layer. A second insulating layer is then applied over the smoothed surface of the first insulating layer to cure defects such as discontinuities in the first insulating layer. Vias (interconnecting holes) are then etched through the first and second insulating layers and a second metal layer is applied with a desired interconnect pattern defined in a conventional manner.

In the preferred embodiment, a third insulating layer is applied over the second insulating layer prior to the second metallization step. The third insulating layer further assures that any defects in the first two insulating layers are corrected. More importantly, the third insulating layer allows formation of stepped vias. The third insulating layer is applied after the vias are first formed through the first two insulating layers. By providing an oversized etch pattern, the vias can be formed through the third insulating layer and into the second to provide the desired stepped configuration. Such a stepped configuration allows the lower portion of the via to remain narrow (which is an advantage in connecting two narrow interconnect lines in the first metal layer) while assuring that metal from the second metal layer will adequately form the via to provide a reliable connection.

DESCRIPTION OF THE PREFERRED EMBODIMENTS

Referring to FIGS. 1-12, a specific method will be described for preparing semiconductor devices according to the present invention. Semiconductor devices are fabricated on silicon wafer substrates 10 (a portion of one being illustrated in FIGS. 1-12). A passivation layer 12 is applied over the devices, and contact holes 16 are formed therein to allow electrical connection through the passivation layer. A first metal layer 14 is deposited over the passivation layer 12. In the preferred embodiment, the first metal layer 14 is a sandwich layer including a tungsten (95%)-titanium (5%) alloy base of about 2000 Angstroms and an aluminum or aluminum (98%)-copper (2%) alloy layer of about 8000 Angstroms. The tungsten-titanium base is passivated by exposure to air prior to applying the aluminum or aluminum-copper layer. For convenience, the first metal layer 14 is illustrated as a single layer in the Figures.

Figure 1:
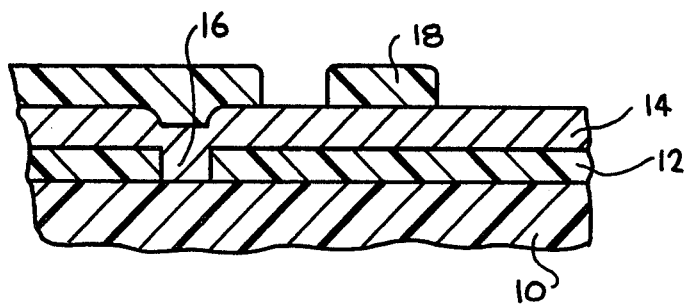
FIGS. 1-12 are cross-sectional views of a portion of a semiconductor device undergoing the processing steps of the present invention.
Figure 2:
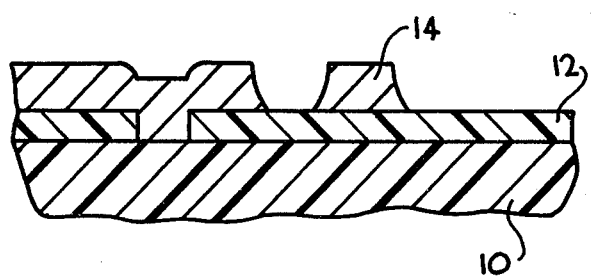

Referring now in particular to FIG. 1, the first metal layer 14 is patterned by photolithographic techniques in a conventional manner. A photoresist layer 18 is applied, exposed to a radiation source through a mask, and developed. The first metal layer 14 is etched and the photoresist 18 removed. Preferably, the aluminum or aluminum alloy of layer 14 is first etched in a conventional phosphoric-nitric-acetic acid mixture, and the photoresist layer 18 is removed with a commercially-available stripping solution. Then in a conventional barrel plasma reactor, the exposed surface is cleaned in an oxygen plasma for about 10 to 30 minutes and in a Freon ® (92%)-oxygen (8%) plasma for about two minutes to clean part of layer 14. The layer 14 is then etched with hydrogen peroxide for about 20 minutes. The patterned metal layer 14 is illustrated in FIG. 2.

Figure 3:
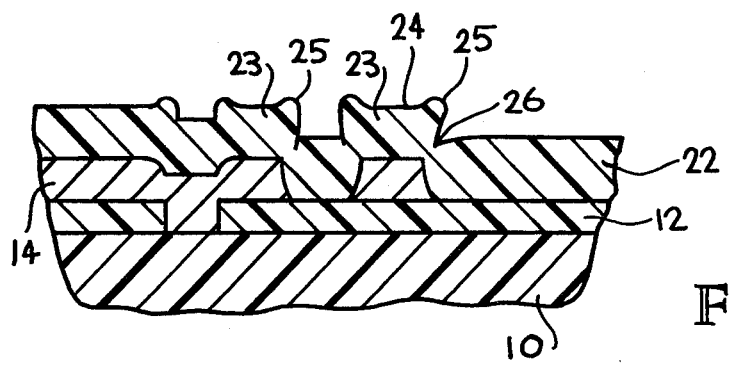
Figure 4:
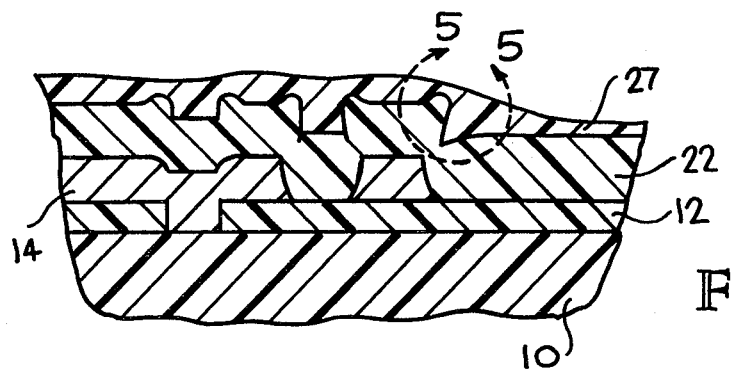

Referring now to FIG. 3, a first insulating layer 22 is applied. Typically, the insulating layer will be silicon-dioxide which is deposited by pyrolysis of silane at an elevated temperature under atmospheric pressure. If desired, the silicon dioxide can be doped with phosphorous by including phosphine gas (typically 5%) in the pyrolysis mixture. The layer 22 will typically have a thickness of about 1 micron.

Applying the insulating layer 22 over the metal layer 14 results in a highly irregular surface having mounds 23 built up over the metal interconnect lines. The mounds 23 themselves are irregular, including cusped regions 24 on the top, outcroppings 25 along their edges, and crevices 26 at the intersection of the mound and the underlying insulating layer 22. Such surface irregularities, as discussed hereinbefore, are a primary cause of the metallization failure when subsequent conductive layers are applied.

In order to smooth the irregular surface of the first insulating layer 22, a planarization layer 27 (FIG. 4) is applied. The planarization material should have a relatively low viscosity (typically below about 25 cps at room temperature) which allows it to flow into the low areas on the surface of the first insulating layer 22 when applied by conventional methods. Conveniently, the planarization layer 27 can be a photoresist spin applied to a thickness of about 3500 Angstroms. The photoresist layer 27 can be further smoothed by baking at a temperature of about 145° C. or higher for about 30 minutes. The planarization layer 27 is illustrated after smoothing in FIG. 4.

The planarization is then accomplished by etching both the planarization layer 27 and the first insulating layer 22. The etch can be carried out with an etchant capable of etching both the planarization layer 27 and the insulating layer 22 at the same rate. In this way, the smooth profile of the planarization layer 27 is imparted without substantial deviation to the insulating layer 22. Preferably, however, the planarization etch will employ an etchant which etches the insulating layer 22 more rapidly than the planarization layer 27. This reduces the time required for the planarization etch and allows the same etchant to be used for the via etch, as described below. Thus, planarization and via formation can be performed in the same reactor. This is an advantage because it simplifies the processing and reduces the likelihood that the device will be damaged as a result of incorrect etching.

A suitable etchant for performing both the planarization and the via etch is a fluorine ionic plasma (92% $CF_4$, 8% $O_2$, 1.75 Torr, 1 W/cm$^2$) adjusted to etch the silicon dioxide and photoresist layers at a ratio of 1.6:1. Although this causes some deviation from the smooth profile of the planarization layer 28, such minor deviations do not lead to metallization failure.

Figure 5A:
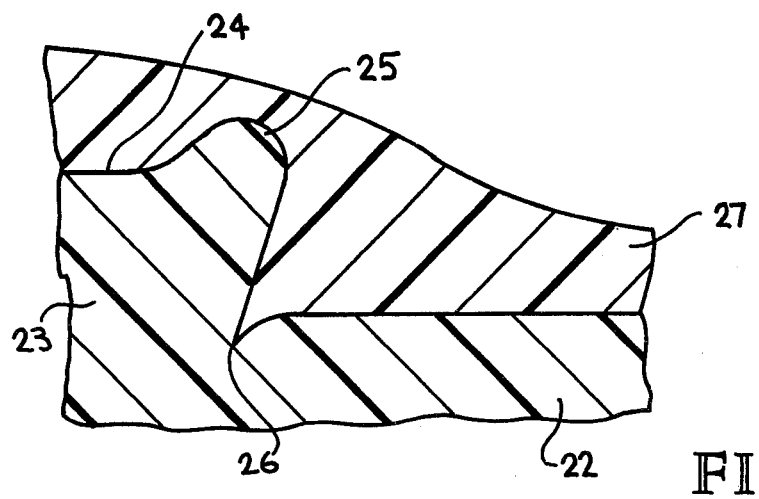
Figure 5B:
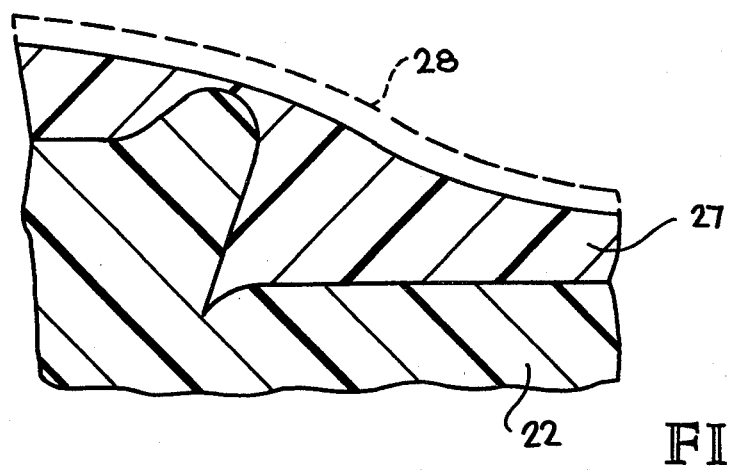

Referring now to FIGS. 5A-5D, the fluorine plasma etch at first acts only on the planarization (photoresist) layer 27. The etch moves along a front which retains the initial profile until reaching the outermost point of the insulating layer 22, as illustrated in FIG. 5B. Broken line 28 represents the initial profile.

Figure 5C:
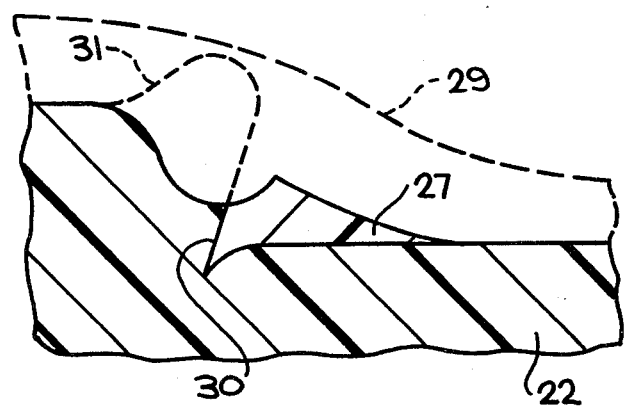
Figure 5D:
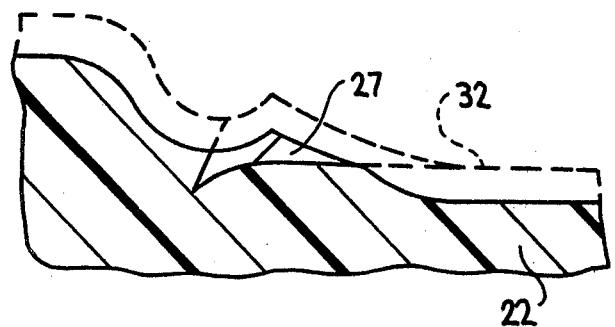

As the etch continues, the insulating layer 22 is etched more quickly than the photoresist layer 27. This causes a deviation in the profile, as illustrated in FIG. 5C. Line 29 represents the profile just prior to the first portion of the insulating layer being exposed. The insulating layer 22 is diminished more rapidly, causing a valley to form at location 30. Line 31 represents the original interface between the insulating layer 22 and the planarization layer 27, which interface has been diminished.

Usually, the entire photoresist layer 22 and a substantial portion of the insulating layer 22 will be removed before stopping the etch. Depending on the initial thickness of the insulating layer 22, however, it may be desirable to leave small areas of the photoresist in place. The photoresist can then be removed by a conventional oxygen plasma etch.

Figure 6:
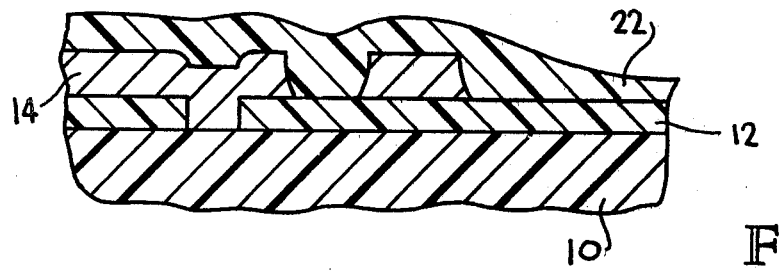
Figure 7:
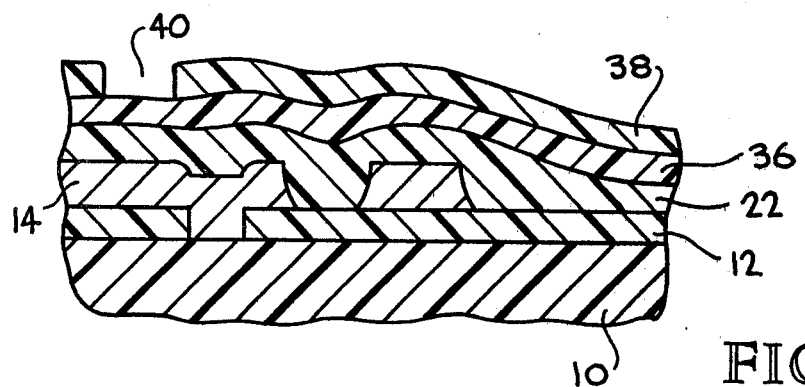

Referring now to FIG. 6, the first insulating layer 22 has been smoothed and has an acceptable profile for receiving subsequent metal layers. Prior to metallization, however, a second insulating layer 36 is applied. The aggregate thickness of both insulating layers should be equal to about 0.75 of the intended final thickness of dielectric required between the metal layers. The planned final thickness will usually be about one micron. Alternatively to applying the second insulating layer 36, the first insulating layer 22 could have been made thicker so that the thickness after planarization would be equal to 0.75 of the intended final thickness. Such thick layers, however, are inconvenient for optical measurement and manufacturing control, and it is preferred to apply the insulating material in two layers. The second insulating layer 36 can be applied in the same manner as described above for the first insulating layer 22.

After application of the second insulating layer 36, the vias or connecting holes necessary for interconnecting the first metal layer 14 and subsequent metal layers must be formed. This will be done using conventional photolithographic techniques. A photoresist layer 38 (FIG. 7) is applied over the second insulating layer 36, exposed to radiation through a mask, and developed in the conventional manner. The vias are then etched, conveniently using the same etchant as was used for the planarization step. In this way, the device can be processed in the same plasma reactor. Photoresist will then be removed, typically with phenolic stripper, and the surface of the device cleaned, typically in a neutral oxygen plasma.

A particular advantage is realized by using an anisotropic or partially anisotropic etchant (i.e., one which provides a lesser lateral etch rate than vertical etch rate) for via formation. The thickness of layer 22 varies due to the planarization, so some of the vias will take longer to etch. Use of anisotropic etching allows a sufficient overetch to assure that vias are properly formed in even the thickest portions of the insulating layers 22 and 36. Preferably, the horizontal etch rate will be at least twice the vertical etch rate.

Figure 8:
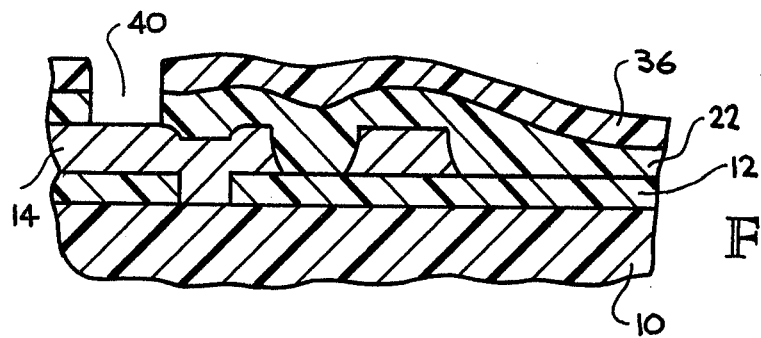

At this point, the device is as illustrated in FIG. 8. The vias, such as via 40, are formed through the insulating layers 22, 36 and a second metal layer could be applied over the surface. Before doing so, however, it is preferred to provide a third insulating layer and form stepped vias. The third insulating layer is necessary in order to cure defects in the insulating layers 22 and 36, usually holes, which may be caused by mask defects, photoresist defects, dielectric hillocks which penetrate the photoresist, and the like. The third layer also allows stepped vias which provide improved metal coverage of via sides and better vertical interconnects between the adjacent metal layers.

Figure 9:
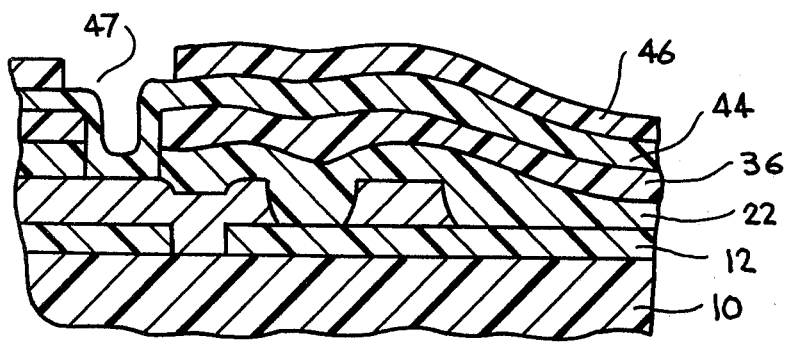

Referring now to FIG. 9, a third insulating layer 44 is deposited over the second insulating layer 36, as described above for the first insulating layer 22. The insulating layer 44 will follow the smooth contours of layers 22 and 36 and partially fill in the vias 40. Layer 44 will be about 0.25 of the intended final thickness of the insulating layers 22, 36 and 44.

Figure 10:
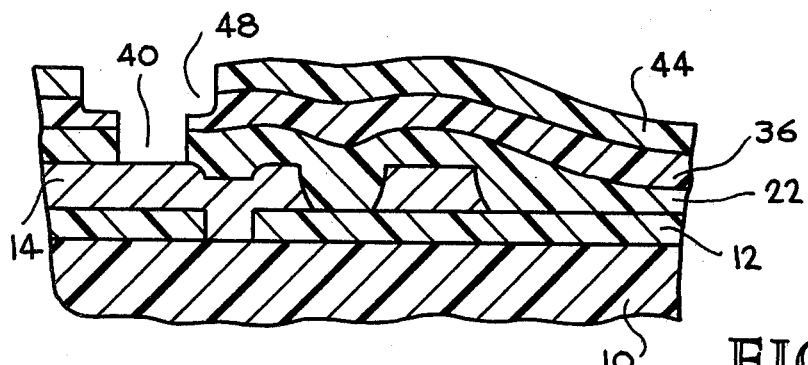

In order to define the stepped vias, a photoresist layer 46 is applied and developed to expose oversized openings 47. By then etching through the openings 47, the tops of the vias 40 are enlarged to a cross-sectional area corresponding to the dimensions of opening 47. By etching to a depth only partly through the combined thickness of the insulating layers 22, 36 and 44, step-shaped vias, as illustrated in FIG. 10, can be formed. By etching nominally half the combined thickness, a half step is formed. Typically, the dimension of the lower part of the via will be from 1 to 5 microns, while the enlarged upper portion of the via will be from 4 to 8 microns larger. Such a configuration allows connection to relatively narrow interconnect lines in the metal layer 14.

Figure 11:
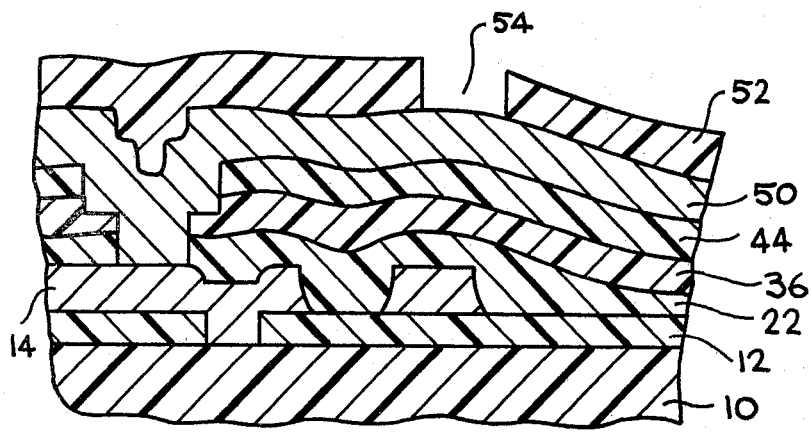

Referring now to FIG. 11, a second metal layer 50 is applied in a conventional manner. Preferably a titanium-tungsten layer will be applied to a thickness of about 800 Angstroms, followed by deposition of an aluminum-copper layer to a depth of about 1500 Angstroms. The titanium enhances contact between the aluminum in the metal layers 14 and 50. The layers may be applied by sputter etching.

Figure 12:
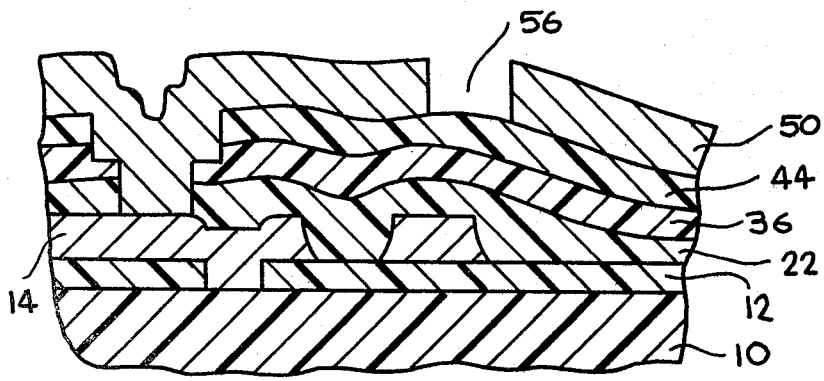

The second metal layer 50 is then patterned in a conventional manner. A photoresist layer 52 is applied and patterned. After etching, the photoresist is removed and the final metal layer is formed, as illustrated in FIG. 12. At this point, if it is desired to add a third (and subsequent) metal layer, steps of the present method may be repeated.

Although the foregoing invention has been described in some detail by way of illustration and example for purposes of clarity of understanding, it will be obvious that certain changes and modifications may be practiced within the scope of the appended claims.

What is claimed is:

1. A method for forming multiple conductive layers on a semiconductor device, said method comprising:

(a) defining a first conductive layer, having a preselected interconnect pattern, on the device;
   (b) applying a first insulating layer over the first conductive layer, said first insulating layer having an irregular profile corresponding to the first conductive layer;
   (c) applying a planarization layer over the first insulating layer, said planarization layer having a smoothed profile relative to that of the first insulating layer;
   (d) etching both the planarization layer and the insulating layer to substantially remove the planarization layer and to impart a smoothed profile to the first insulating layer;
   (e) forming vias through the first insulating layer at preselected locations;
   (f) applying a second metal layer over the second insulating layer so that said second metal layer connects with the first metal layer through the vias; and
   (g) defining a preselected interconnect pattern in the second layer.

2. A method as in claim 1, wherein a second insulating layer is applied over the first insulating layer after step (d) and before step (e).

3. A method as in claim 1, wherein a third insulating layer is applied over the second insulating layer after step (e), and wherein the vias are further etched to define a stepped configuration.

4. A method as in claim 3, wherein the step is formed in the second insulating layer.

5. A method as in claim 1, wherein steps (b) through (g) are repeated to add additional metal layers on the device.

6. A method as in claim 1, wherein the metal layers are aluminum, aluminum-copper, aluminum-silicon, or aluminum-copper-silicon.

7. A method as in claim 1, wherein the insulating layers are silicon dioxide or phosphorous-silicon dioxide.

8. A method as in claim 7, wherein the insulating layers are deposited by pyrolysis of silane or silane in the presence of phosphine.

9. A method as in claim 1, wherein the vias are formed by plasma etching in step (e).

10. A method as in claim 1, wherein the planarization layer and first insulating layer are plasma etched in step (d).

11. A method as in claim 9, wherein the same etchant is used in steps (d) and (e).

12. A method as in claim 11, wherein the etchant is substantially anisotropic and is selected to have an etch ratio of 1.6:1.0 (insulating layer:planarization layer).

13. A method as in claim 1, wherein the planarization layer is photoresist.

14. An improved method for forming multiple interconnect layers on a semiconductor device, said method including the steps of:

(a) defining a first metal layer, having a preselected interconnect pattern, on the device;
   (b) applying a first insulating layer of the first metal layer;
   (c) forming vias through the first insulating layer; and
   (d) defining a second metal layer, having a preselected interconnect pattern, over the first insulating layer;

wherein the improvement comprises:

planarizing the first insulating layer by applying a planarization layer over the first insulating layer and etching both the planarization layer and the first insulating layer to impart a smoothed profile to the first insulating layer;

applying a second insulating layer over the smoothed first insulating layer;

forming the vias through both the first and second insulating layers at preselected locations;

applying a third insulating layer over the second insulating layer; and enlarging the upper portion of the vias to define a stepped configuration prior to applying the second metal layer.

15. An improved method as in claim 14, wherein the enlarged portion of the vias extends about half way through the combined thickness of the three insulating layers.

16. An improved method as in claim 15, wherein the enlarged portion of the vias terminates in the second insulating layer.

17. An improved method as in claim 14, wherein the metal layers are aluminum, aluminum-copper, aluminum-silicon, or aluminum-silicon-copper.

18. An improved method as in claim 14, wherein the insulating layers are silicon dioxide or phosphorous-silicon dioxide.

19. An improved method as in claim 18, wherein the insulating layers are deposited by pyrolysis of silane or silane in the presence of phosphine.

20. A method as in claim 14, wherein the vias are formed and enlarged by plasma etching.

21. A method as in claim 14, wherein the planarization layer is photoresist.

22. A method as in claim 14, wherein the planarization layer and first insulating layer are planarized by plasma etching.

23. A method as in claim 14, wherein the via etching and planarization etching are performed using the same etchant.

24. A method as in claim 23, wherein the etchant is selected to have an etch ratio of about 1.6:1.0 (insulating layer:planarization layer).

25. A method as in claim 17, wherein the first metal layer is underlaid by a titanium-tungsten layer.

26. A method as in claim 17, wherein the second metal layer is underlaid by a layer which contains titanium.

27. A method as in claim 17, wherein all metal layers are sandwich layers having a tungsten-titanium layer and an aluminum or aluminum-copper layer.

28. A method as in claim 24, wherein the etchant has an anisotropic etch ratio of 1 to 2 or more (horizontal etch to vertical etch).

* * * * *